United States Patent
Becker et al.

(10) Patent No.: US 6,175,229 B1
(45) Date of Patent: Jan. 16, 2001

(54) ELECTRICAL CURRENT SENSING APPARATUS

(75) Inventors: James A. Becker, Grafton; Kurt V. Eckroth; Mark G. Solveson, both of Oconomowoc, all of WI (US)

(73) Assignee: Eaton Corporation, Cleveland, OH (US)

(*) Notice: Under 35 U.S.C. 154(b), the term of this patent shall be extended for 0 days.

(21) Appl. No.: 09/265,272

(22) Filed: Mar. 9, 1999

(51) Int. Cl.⁷ .............................. G01R 33/06; G01R 1/20
(52) U.S. Cl. ............................... 324/117 H; 324/127
(58) Field of Search ........................ 324/117 H, 251, 324/127, 207.2; 338/32 H

(56) References Cited

U.S. PATENT DOCUMENTS

| | | | |
|---|---|---|---|
| 2,886,779 | * 5/1959 | Kuhrt et al. | 324/117 H |
| 4,059,798 | * 11/1977 | Dierker et al. | 324/127 |
| 4,234,846 | * 11/1980 | Maringer | 324/117 H |
| 4,539,520 | 9/1985 | McBride | 324/117 H |
| 4,587,509 | 5/1986 | Pitt et al. | 338/32 H |
| 4,616,207 | 10/1986 | Knapp, Jr. et al. | 338/32 H |
| 4,823,075 | 4/1989 | Alley | 324/117 H |
| 5,103,163 | * 4/1992 | McLyman | 324/117 H |
| 5,172,052 | * 12/1992 | Wells | 324/117 R |
| 5,241,263 | * 8/1993 | Naoi et al. | 324/117 H |
| 5,416,407 | 5/1995 | Drafts | 324/117 H |
| 5,479,095 | 12/1995 | Michalek et al. | 324/117 H |
| 5,615,075 | 3/1997 | Kim | 324/117 H |

FOREIGN PATENT DOCUMENTS

| | | | |
|---|---|---|---|
| 2619925 | * 3/1989 | (FR) | 324/117 H |
| 0107270 | * 6/1984 | (JP) | 324/117 H |
| 0170073 | * 7/1991 | (JP) | 324/117 H |
| 1525595 | * 11/1989 | (SU) | 324/117 H |

* cited by examiner

Primary Examiner—Jay Patidar
(74) Attorney, Agent, or Firm—Tarolli, Sundheim, Covell, Tummino & Szabo L.L.P.

(57) ABSTRACT

An apparatus for use in sensing electrical current in a conductor includes a flux concentrator and one or more magnetic flux sensors. The flux concentrator includes main sections which are formed of a magnetic material. One or more intermediate sections, formed of a nonmagnetic material, extend between the main sections of the magnetic flux concentrator. The main sections and intermediate section of the magnetic flux concentrator cooperate to at least define an opening through which a portion of the conductor extends.

64 Claims, 6 Drawing Sheets

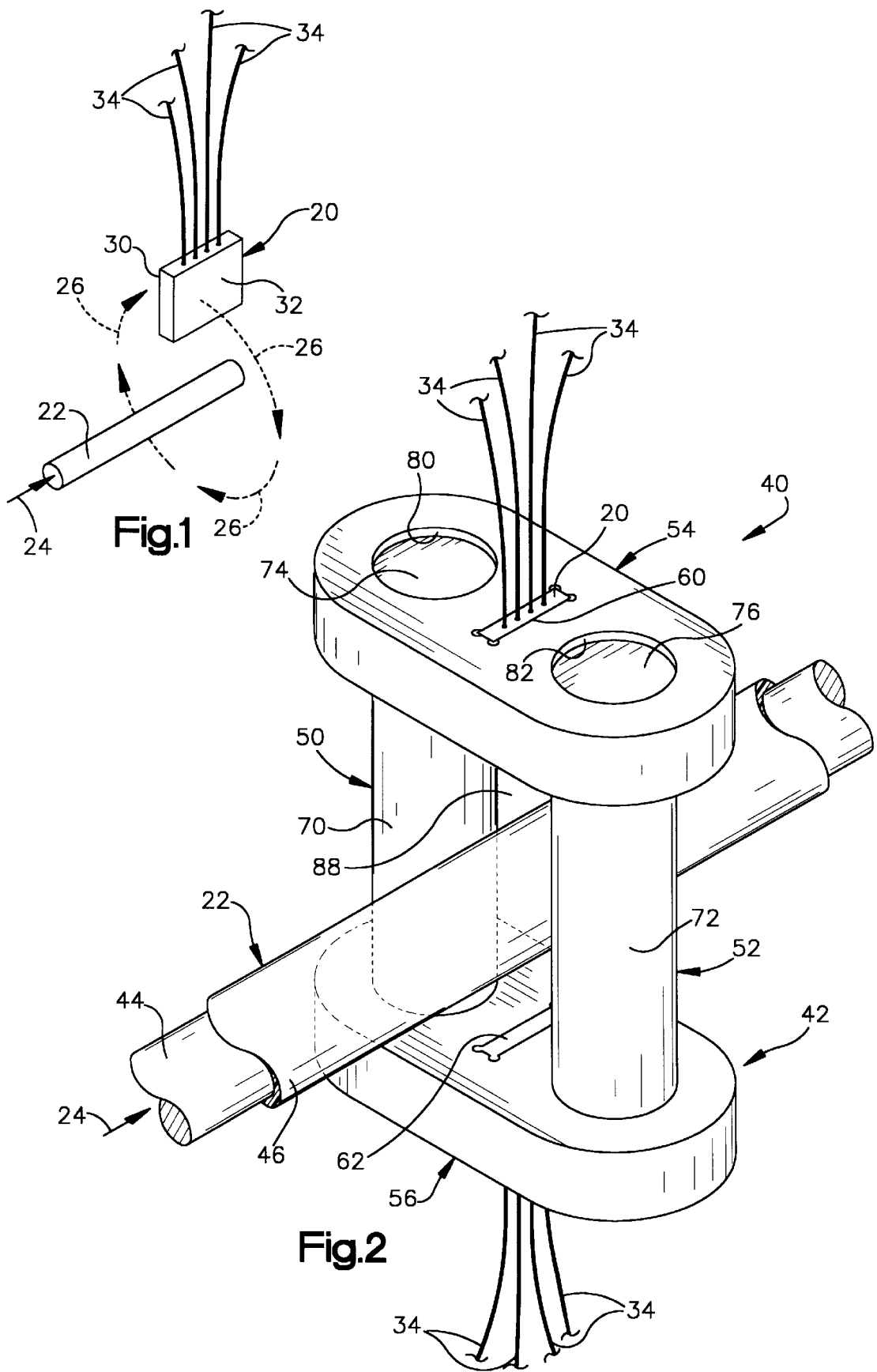

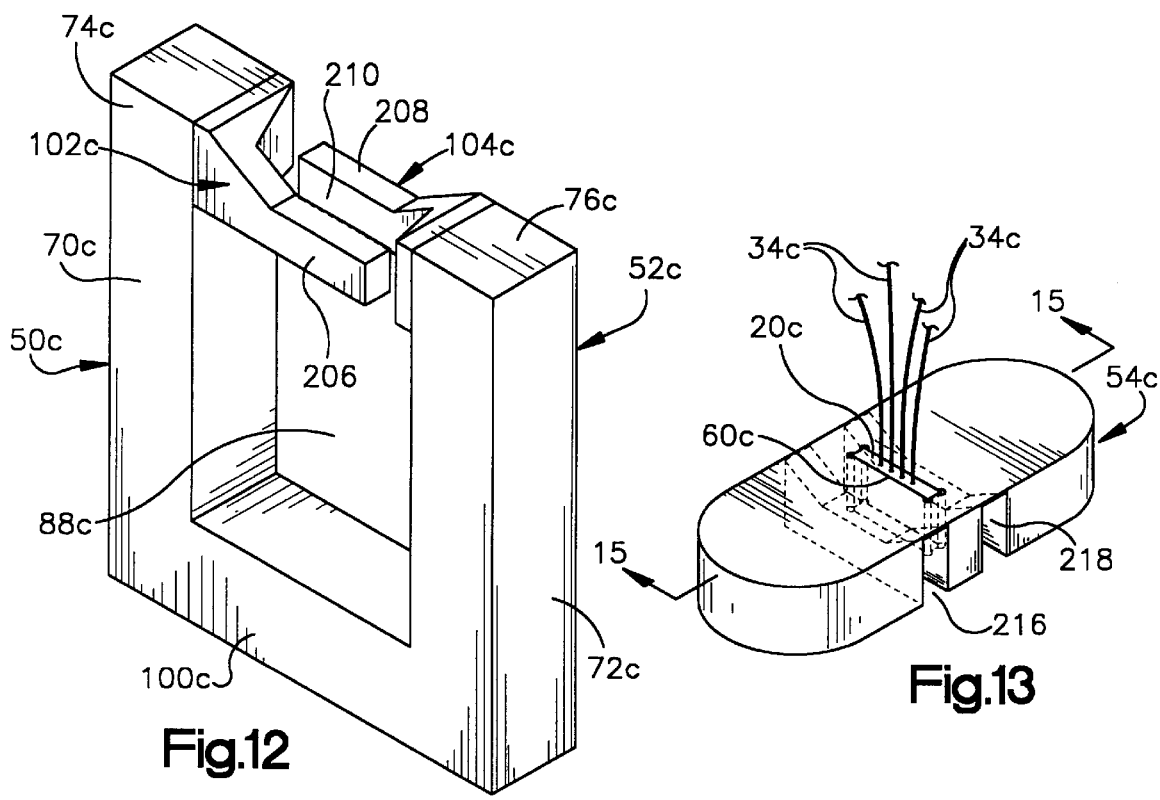
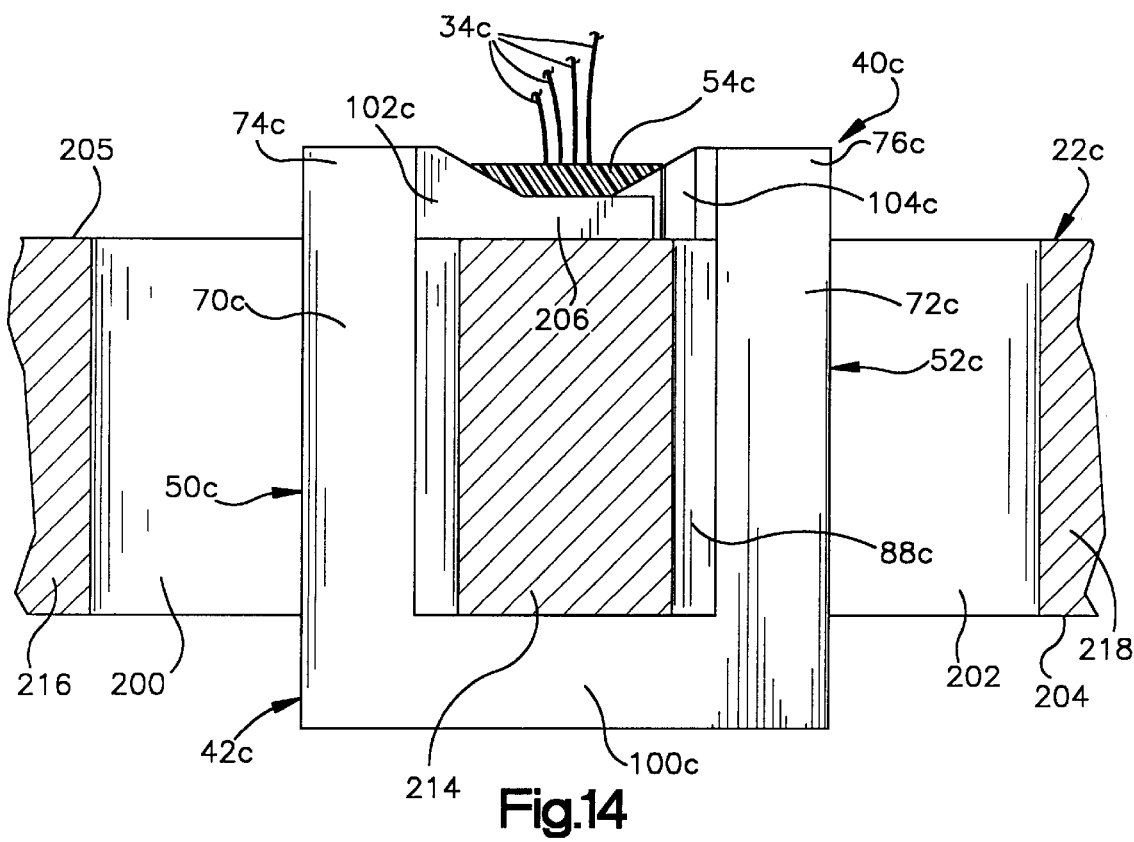

ELECTRICAL CURRENT SENSING APPARATUS

BACKGROUND OF THE INVENTION

The present invention relates to a new and improved apparatus for use in sensing electrical current in a conductor and more specifically to an apparatus which utilizes a sensor which is responsive to magnetic flux emanating from a conductor to provide an output signal which varies as a function of the current in the conductor.

Current transformers or toroids have previously been utilized to sense the amount of current passing through a conductor. Current transformers are relatively large in volume and mass. Several different size current transformers are required to accommodate various current levels. Current transformers are frequency sensitive and must be derated to thoroughly compensate for a continuous thermal current factor.

It has previously been suggested that a magnetic flux sensor, such as a Hall effect sensor, could be utilized to provide an output signal which varies as a function of the amount of current being conducted through a conductor. Hall effect sensors have been positioned at different distances from the conductor. The use of magnetic flux sensors, such as Hall effect sensors, is disclosed in U.S. Pat. Nos. 4,539,520; 4,587,509; 5,172,052; and 5,416,407.

SUMMARY OF THE INVENTION

The present invention provides a new and improved apparatus for use in sensing electrical current in a conductor. The apparatus includes a magnetic flux concentrator which may extend around a portion of a conductor. The magnetic flux concentrator may include main sections formed of a magnetic material and one or more intermediate sections formed of a nonmagnetic material. A magnetic flux sensor is disposed on an intermediate section of the magnetic flux concentrator. A plurality of magnetic flux sensors may be utilized if desired.

The main sections of the magnetic flux concentrator may include magnetic flux conductive columns which are connected with one or more intermediate sections. The main sections may also include magnetic flux conductive connector sections which project from the columns. The connector sections may be engaged by an intermediate section formed of a nonmagnetic material. The columns may be at least partially disposed in openings in the conductor. A magnetic flux conductive base may interconnect the columns.

BRIEF DESCRIPTION OF THE DRAWINGS

The foregoing and other features of the invention will become more apparent upon a consideration of the following description taken in connection with the accompanying drawings wherein:

FIG. 1 is a schematic illustration of the manner in which a magnetic flux sensor is exposed to magnetic flux emanating from a conductor of electrical current;

FIG. 2 is a schematic pictorial illustration of an electrical current sensing apparatus constructed in accordance with the present invention;

FIG. 12 is a pictorial illustration depicting the construction of a portion of the electrical current sensing apparatus of FIG. 10;

FIG. 13 is a pictorial illustration of an intermediate section of the electrical current sensing apparatus illustrated in FIG. 10;

FIG. 14 is a fragmentary sectional view, taken generally along the line 14—14 of FIG. 10.

DESCRIPTION OF ONE SPECIFIC PREFERRED EMBODIMENTS OF THE INVENTION

General Description

Figure 3:
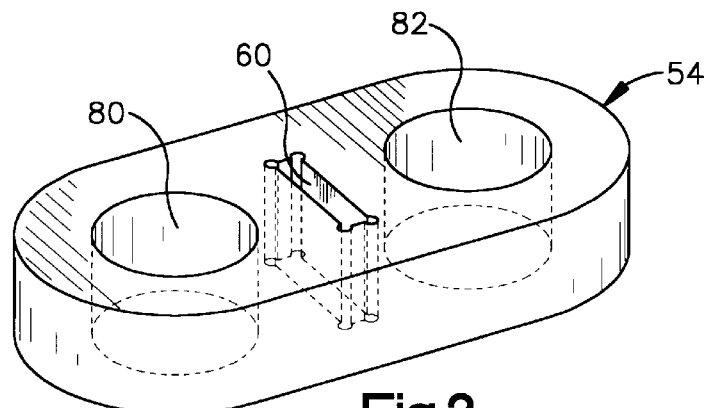
FIG. 3 is a pictorial illustration of an intermediate section of the electrical current sensing apparatus of FIG. 2.

The manner in which a magnetic flux sensor 20 is positioned relative to an electrical conductor 22 is illustrated schematically in FIG. 1. The direction of flow of current through the conductor 22 is indicated schematically by an arrow 24. Magnetic flux emanating from the conductor 22 is indicated schematically by dashed arrows 26.

The magnetic flux sensor 20 has flat parallel side surfaces 30 and 32 which are magnetic flux sensitive, that is, surfaces between which the magnet flux 26 flows as it is detected by the magnetic flux sensor 20. The magnetic flux 26 causes the magnetic flux sensor 20 to provide output signals over electrical leads indicated schematically at 34. The output signals conducted over the leads 34 vary as a function of variations in the current 24 being conducted through the conductor 22. The leads 34 are connected with suitable control circuitry (not shown) which initiates a control function in response to variations in the current 24 conducted through the conductor 22. The leads 34 and/or magnetic flux sensor 20 may be connected with a printed circuit board (not shown).

It is contemplated that many different known types of magnetic flux sensors 20 could be utilized to detect variations in the magnetic flux 26. However, in the illustrated embodiments of the invention, the magnetic flux sensor 20 is a Hall effect sensor. It should be understood that other known types of magnetic flux sensors could be utilized if desired.

Although only a single magnetic flux sensor 20 has been illustrated in FIG. 1, it should be understood that a plurality of magnetic flux sensors 20 may be utilized to detect variations in the flow of current 24 through the conductor 22. The magnetic flux sensors 20 may be positioned at many different locations relative to the conductor 24. For example, a second magnetic flux sensor 20 may be positioned diametrically opposite from the magnet flux sensor 20 illustrated in FIG. 1. When a plurality of flux sensors 20 are utilized, they may have different sensitivities to magnetic flux.

If desired, additional magnetic flux sensors 20 may be positioned at axially spaced apart locations along the conductor 22. By using magnetic flux sensors 20 having different sensitivities to flux, a relatively large range of current variations can be detected. Thus, a plurality of magnetic flux sensors 20 may be located at each of a plurality of locations which are spaced axially apart along the conductor 22. The magnetic flux sensors 20 at the different locations may have different sensitivities to magnetic flux.

An electric current sensing apparatus 40, constructed in accordance with the present invention, is illustrated in FIG. 2. The electrical current sensing apparatus 40 utilizes the principles illustrated schematically in FIG. 1. The electrical current sensing apparatus 40 (FIG. 2) includes a magnetic flux concentrator assembly 42 which concentrates magnetic flux, indicated schematically at 26 in FIG. 1, relative to the magnetic flux sensor 20.

In the embodiment of the invention illustrated in FIG. 2, the conductor 22 is an electrical cable having an electrically conductive body portion 44. The body portion 44 is enclosed by a layer 46 of insulating material. Although one specific type of conductor 22, that is a cable, has been illustrated in FIG. 2, it should be understood that the electrical current sensing apparatus 40 could be associated with other types of conductors if desired. For example, the electrical current sensing apparatus 40 could be associated with a bus bar.

The magnetic flux concentrator assembly 42 includes a pair of main sections 50 and 52 formed of magnetic material, that is, metal which may contain ferromagnetic elements, such as iron, nickel and/or cobalt. The magnetic materials of the main sections 50 and 52 are easily demagnetized and have very little residual magnetism.

Upper and lower intermediate sections 54 and 56 are connected with the main sections 50 and 52 of the magnetic flux concentrator assembly 42. The intermediate sections 54 and 56 are formed of a nonmagnetic material, that is, materials in which magnetic effects are weak. For example, the intermediate sections 54 and 56 may be formed of a suitable polymeric material. Although two intermediate sections 54 and 56 are provided in the embodiment of the invention illustrated in FIG. 2, a single intermediate section or more than two intermediate sections may be provided if desired.

The rectangular magnetic flux sensor 20 (FIG. 2) is disposed in a rectangular recess 60 formed in the upper intermediate section 54. A second magnetic flux sensor 20 (not shown) is disposed in a recess 62 in the lower intermediate section 56. The upper and lower magnetic flux sensors 20 are connected with suitable control circuitry by leads 34. Although two flux sensors 20 are provided in the embodiment of the invention illustrated in FIG. 2, a single flux sensor or more than two flux sensors may be utilized if desired.

The upper and lower magnetic flux sensors 20 may have the same or different sensitivities to magnetic flux. The upper and lower magnetic flux sensors 20 are positioned with magnetic flux sensitive surfaces 30 and 32 (FIG. 1) extending generally perpendicular to a path of flow of magnetic flux emanating from the conductor 22. The magnetic flux sensitive surfaces 30 and 32 on the upper and lower magnetic flux sensors 20 extend parallel to each other and parallel to a longitudinal central axis of the conductor 22. This results in the magnetic flux sensitive surfaces 30 and 32 of the upper and lower magnetic flux sensors 20 extending perpendicular to the path of the magnetic flux 26. However, the longitudinal central axis of the conductor 22 could be skewed relative to the magnetic flux sensitive surfaces 30 and 32 if desired.

In the illustrated embodiment the magnet flux concentrator assembly 42, the upper and lower magnet flux sensors 20 are disposed equal distances from the conductor 22. However, the upper and lower magnetic flux sensors 20 could be located at different distances from the conductor 22 if desired. For example, the lower magnetic flux sensor 20 could be located further from the conductor 22 than the upper magnetic flux sensor.

The flux 26 emanating from the conductor 22 is conducted along a path which is perpendicular to the flux sensitive surfaces 30 and 32 at the locations where the flux sensors 20 intersect the path of the flux.

Magnetic Flux Concentrator

The magnetic flux concentrator assembly 42 includes magnetic flux conductive main sections 50 and 52 formed of a magnetic material and intermediate sections 54 and 56 formed of a nonmagnetic material. In the illustrated embodiment of the invention, the magnetic flux conductive main sections 50 and 52 include cylindrical metal columns 70 and 72 containing iron.

The magnetic flux conductive columns 70 and 72 have parallel longitudinal central axes which are disposed in a plane which extends perpendicular to a longitudinal central axis of the conductor 22. The plane in which the parallel central axes of the columns 70 and 72 are disposed extends perpendicular to the flux sensitive side surfaces 30 and 32 of the upper and lower magnetic flux sensors 20. The central axes of the columns 70 and 72 are spaced equal distances from the upper and lower magnetic flux sensors 20. It should be understood that the magnetic flux concentrator assembly 42 could have a different construction if desired.

The intermediate section 54 of the magnetic flux concentrator assembly 42 is fixedly connected with upper end portions 74 and 76 of the columns 70 and 72. Thus, the intermediate section 54 of the magnetic flux concentrator 42 is provided with a pair of cylindrical recesses 80 and 82 (FIG. 3) which receive the upper end portions 74 and 76 (FIG. 2) of the columns 70 and 72. The cylindrical recesses 80 and 82 (FIG. 3) extend axially through the intermediate section 54. However, if desired, the cylindrical recesses 80 and 82 could be closed off at their upper end portions.

In the illustrated embodiment of the invention, there is an interference fit between the cylindrical outer side surfaces of he upper end portions 74 and 76 of the columns 70 and 72 and cylindrical inner side surfaces of the recesses 80 and 82. This interference fit is effective to fixedly interconnect the intermediate section 54 and the columns 70 and 72. However, suitable fasteners could be utilized to interconnect the intermediate section 54 and the columns 70 and 72.

The rectangular recess 60 which receives the magnetic flux sensor 20 (FIGS. 2 and 3) is disposed midway between the cylindrical recesses 80 and 82 in the intermediate section 54 (FIG. 3). The wires 34 may be attached to a printed circuit board (not shown). The side surfaces of the recess 60 have a close fit with the rectangular flux sensor 20 to orient the flux sensor perpendicular to the path of the magnetic flux.

In the illustrated embodiment of the invention, the recess 60 is open-ended, that is, the recess 60 extends through the intermediate section 54. However, if desired, the end of the recess 60 toward the conductor 22, that is the lower end, could be closed.

Although only the upper intermediate section 54 has been illustrated in FIG. 3, it should be understood that the lower intermediate section 56 (FIG. 2) has the same construction as the upper intermediate section 54. Although it is believed that it may be preferred to provide magnetic flux sensors 20 in both the upper intermediate section 54 and the lower intermediate section 56, the flux sensor could be omitted from one of the sections if desired, for example, the lower intermediate section 56.

In the embodiment of the magnetic flux concentrator assembly 42 illustrated in FIG. 2, the conductor 22 extends through a generally rectangular opening 88 which is defined by the columns 70 and 72 and upper and lower intermediate sections 54 and 56. The opening 88 is large enough so that the conductor 22 is spaced from the columns 70 and 72 and upper and lower intermediate sections 54 and 56. The longitudinal central axis of the conductor 22 extends through the center of the opening 88. If desired, the opening 88 could have a configuration other than the illustrated rectangular configuration. For example, the opening 88 could have a circular configuration.

If desired, the distance between the columns 70 and 72 may be relatively small. The columns 70 and 72 would then engage opposite sides of the portion of the conductor 22 which extends through the opening 88. If desired, the size of the opening 88 could be reduced to such an extent that both the columns 70 and 72 and the intermediate sections 54 and 56 engage the portion of the conductor 22 which extends through the opening.

The magnetic flux concentrator assembly 42 may be supported by engagement with the conductor 22. However, if desired, suitable brackets may be provided to connect the magnet flux concentrator assembly 42 with the conductor 22 and to position the conductor in the center of the opening 88 in a spaced apart relationship with the magnet flux concentrator. The brackets may be formed of a magnetic and/or nonmagnetic material and connected with the columns 70 and 72 and/or the intermediate sections 54 and 56. If desired, the magnetic flux concentrator assembly 42 could be supported by structure in the environment around the conductor 22 rather than being supported by the conductor itself.

Although the intermediate sections 54 and 56 of the magnetic flux concentrator assembly 42 have flat parallel major side surfaces, it is contemplated that the intermediate sections could be formed with a different configuration if desired. For example, it is contemplated that the upper intermediate section 54 could be constructed so as to extend downward (as viewed in FIG. 2) into engagement with the conductor 22. Similarly, the lower intermediate section 56 could be constructed so as to extend upward into engagement with the conductor 22. If this is done, the portions of the intermediate sections 54 and 56 may have surfaces with a configuration which corresponds to the configuration of the exterior of the conductor 22.

Although the intermediate sections 54 and 56 could be extended to engage the conductor 22, it is believed that it may be desired to maintain the sensors 20 in the positions illustrated in FIG. 2 relative to the conductor and the columns 70 and 72. If the intermediate sections 54 and 56 are extended to engage the conductor 22, the intermediate sections could be configured so as to enclose a larger portion, if not all, of the columns 70 and 72. This would result in the columns 70 and 72 being supported by the intermediate sections 54 and 56.

In the embodiment of the magnetic flux concentrator assembly 42 illustrated in FIG. 2, the opening 88 has a generally rectangular configuration and the conductor 22 has a cylindrical configuration. However, it is contemplated that the opening 88 could have a different configuration if desired. If the size of the opening corresponds to the size of the conductor 22, positioning of the magnetic flux concentrator 42 in any desired location along the length of the conductor 22 would be facilitated. If this is done, it is contemplated that the magnetic flux concentrator 42 may be formed in sections which are interconnected by suitable connectors to enable the magnetic flux concentrator to be clamped onto the conductor 22 at a selected location along the length of the conductor.

Stray Flux

Figure 4:
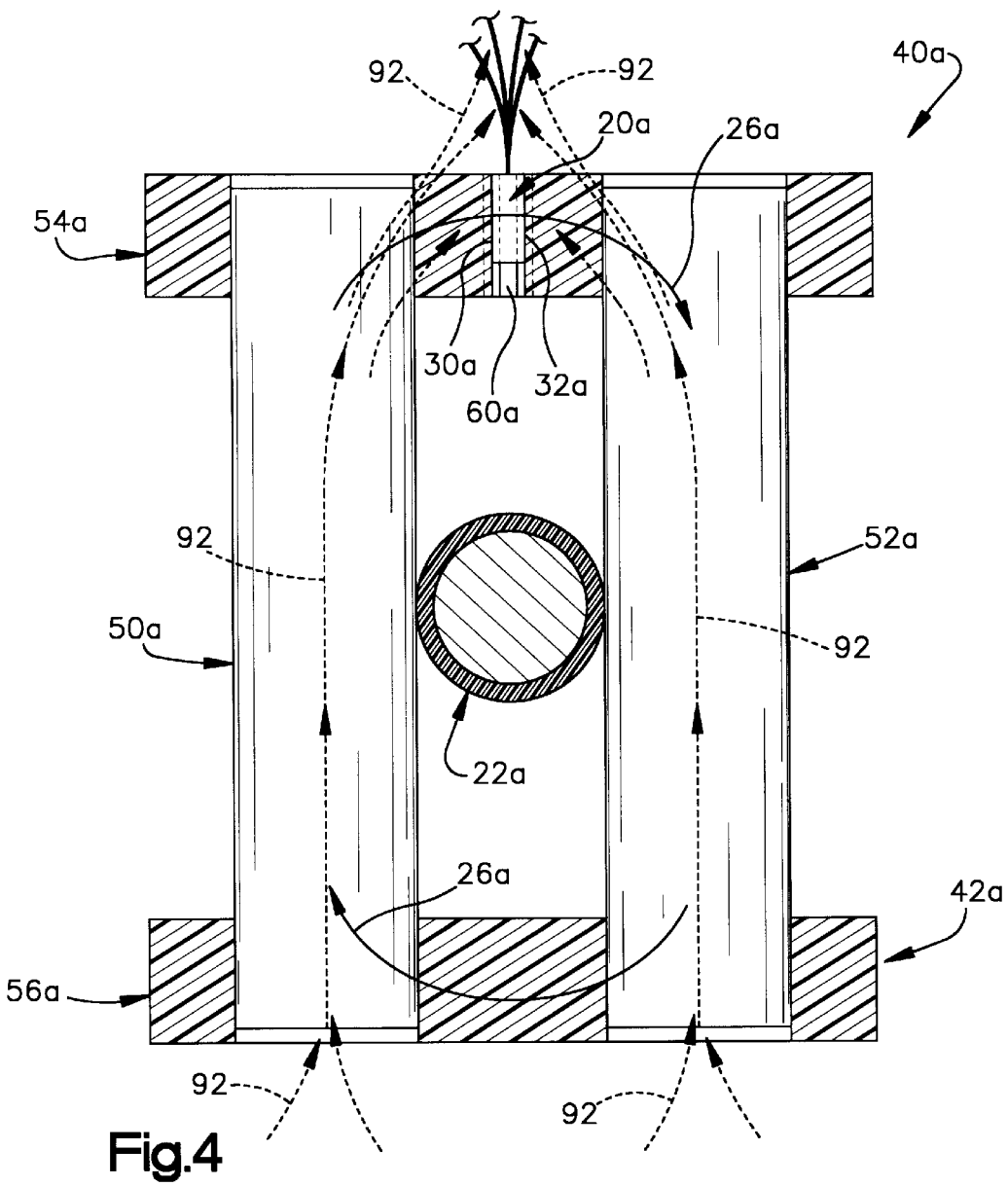
FIG. 4 is a simplified schematic illustration depicting the manner in which a second embodiment of the electrical current sensing apparatus is unaffected by magnetic flux radiating from adjacent conductors.

In the embodiment of the invention illustrated in FIG. 4, the electrical current sensing apparatus is positioned in a magnetic flux field emanating from a conductor disposed in the same horizontal plane as a conductor extending through the magnetic flux concentrator. In this situation, it is contemplated that the magnetic flux concentrator may have a null point at the location where the magnetic flux sensor is located. This will result in the magnetic flux sensor responding only to variations in the magnetic flux emanating from the conductor which extends through the magnetic flux concentrator and not to flux emanating from another conductor in the same horizontal plane. Since the embodiment of the invention illustrated in FIG. 4 is generally similar to the embodiment of the invention illustrated in FIGS. 1–3, similar numerals will be utilized to designate similar components, the suffix letter "a" being associated with the numerals of FIG. 4 in order to avoid confusion.

An electrical current sensing apparatus 40a includes a magnetic flux concentrator assembly 42a which encloses a portion of a conductor 22a. The magnetic flux concentrator assembly 42a includes main sections 50a and 52a and upper and lower intermediate sections 54a and 56a. A magnetic flux sensor 20a is mounted in a recess 60a in the upper intermediate section 54a. Although the magnetic flux sensor 20a is a Hall effect device, other known types of magnetic flux sensors could be utilized if desired. In the embodiment of the invention illustrated in FIG. 4, there is only one magnetic flux sensor 20a. Thus, there is no magnetic flux sensor in the lower intermediate section 56a.

A portion of the flux emanating from the conductor 22a is indicated schematically in solid lines at 26a in FIG. 4. Although only arrows indicating the flux 26a passing from the main section 50a through the upper intermediate section 54a to the main section 52a and flux 26a passing from the main section 52a through the lower intermediate section 56a to the main section 50a has been indicated by solid arrows in FIG. 4, it should be understood that the flux 26a emanating from the conductor 22a is conducted axially through the main sections 50a and 52a. The magnetic flux sensor 20a is located with flux sensitive side surfaces 30a and 32a extending perpendicular to the magnetic flux 26a emanating from the conductor 22a.

The conductor 22a may be one conductor of a multiphase, multi-conductor system. In addition to the magnetic flux emanating from the conductor 22a, the magnetic flux concentrator assembly 42a is exposed to flux emanating from parallel adjacent conductors disposed in the same horizontal plane as the conductor 22a. This flux may be referred to as stray flux. The stray flux from adjacent conductors has been indicated schematically in dashed lines at 92 in FIG. 4.

The stray magnetic flux 92 is attracted to the metal main sections 50a and 52a of the magnetic flux concentrator assembly 42a due to their high permeability. The stray magnetic flux 92 from the adjacent conductors travels along the main sections 50a and 52a to the upper intermediate section 54a. The main sections 50a and 52a are formed of a magnetic material which is easily demagnetized. The stray magnetic flux 52a then exits from the magnetic flux concentrator 42a into space immediately above (as viewed in FIG. 4) the magnetic flux sensor 20a.

The stray magnetic flux 92a has equal strengths on opposite sides of the sensor 20a. The stray magnetic flux 92 on opposite sides of the sensor 20a are oppositely directed to cancel each other. This results in the stray magnetic flux 92 having almost no effect on the output from the magnetic flux sensor 20a. This is because the magnetic flux sensor 20a is disposed at a near null area in the stray magnetic flux field. Therefore, the output from the magnetic flux sensor 20a varies as a function of only variations in the magnetic flux 26a emanating from the conductor 22a.

In the embodiment of the invention illustrated in FIG. 4, the main sections 50a and 52a engage opposite sides of the conductor 22a. However, the distance between the main sections 50a and 52a could be increased to have space between opposite sides of the conductor 22a and the main sections. If desired, suitable brackets could be provided to connect the magnetic flux concentrator 42a with the conductor 22a. Alternatively, the intermediate sections 54a and 56a could be extended to engage the conductor 22a.

The magnetic flux concentrator assembly 42a has the same general construction as the magnetic flux concentrator assembly 42 of FIGS. 1–3. However, the magnetic flux concentrator assembly 42a has only a single magnetic flux sensor 20a. If desired, a second magnetic flux sensor may be provided in association with the lower intermediate section 56a. In the illustrated embodiment of the invention, the upper and lower intermediate sections 54a and 56a are formed of a nonmagnetic material. When only one sensor 20a is utilized in the upper intermediate section 54a, the lower intermediate section 56a may be formed of a magnetic material.

Magnetic Flux Concentrator-Third Embodiment

In the embodiments of the invention illustrated in FIGS. 2 and 4, the magnetic flux concentrator has one piece main sections 50 and 52. In the embodiment of the magnetic flux concentrator illustrated in FIGS. 5–9, a plurality of pieces are utilized to form the main sections of the magnetic flux concentrator with a desired length. Since the embodiment of the invention illustrated in FIGS. 5 through 9 is generally similar to the embodiment of the invention illustrated in FIGS. 1–4, similar numerals will be utilized to designate similar components, the suffix letter "b" being associated with the numerals of FIGS. 5–9 to avoid confusion.

A magnetic flux sensor 20b (FIG. 5) is utilized to sense magnetic flux emanating from a conductor 22b. Although any desired magnetic flux sensor may be utilized, the magnetic flux sensor 20b is a Hall effect device. In the embodiment of the invention illustrated in FIG. 5, the conductor 22b is a metal bus bar, rather than a cable as illustrated in FIG. 2. However, it should be understood that the conductor 22 of FIG. 2 could be a bus bar or a portion of a bus bar if desired.

Figure 5:
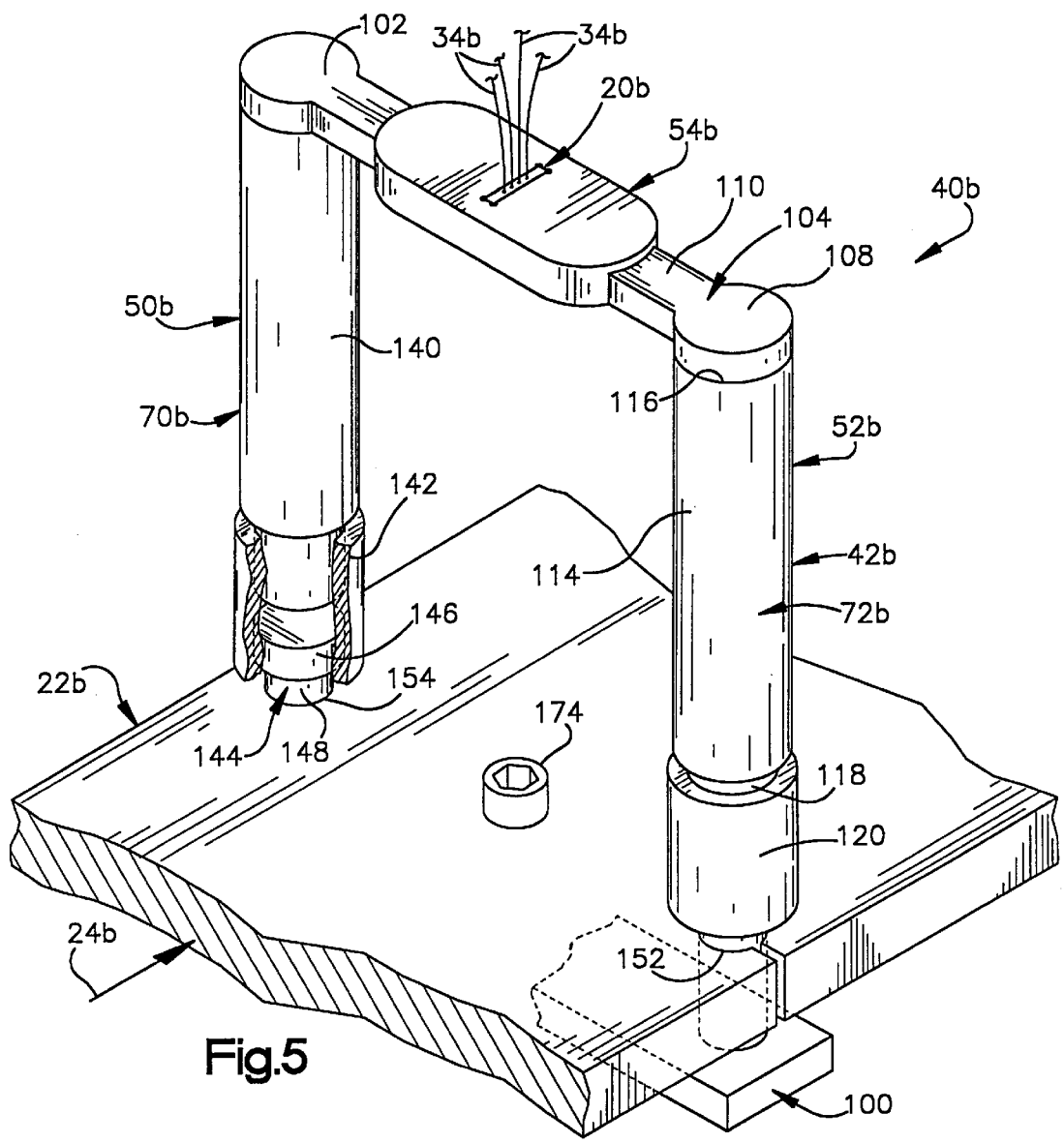
FIG. 5 is a schematic pictorial illustration of a third embodiment of the electrical current sensing apparatus in association with a bus bar.
Figure 6:
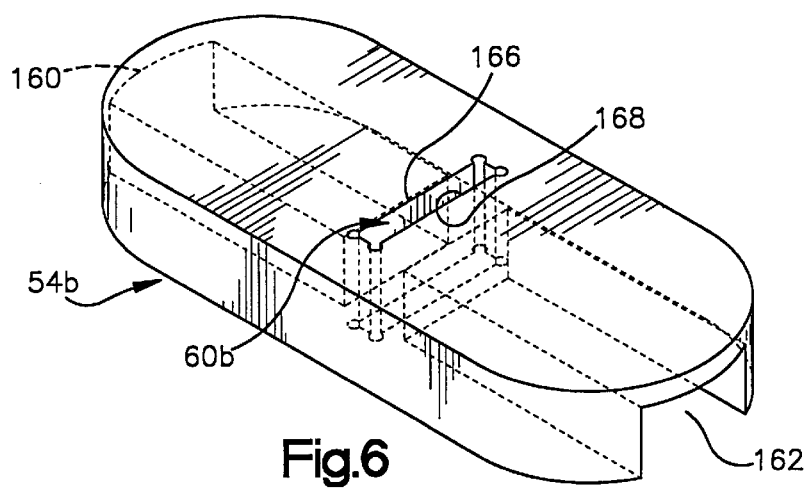
FIG. 6 is an enlarged pictorial illustration of an intermediate section of the electrical current sensing apparatus of FIG. 5.
Figure 8:
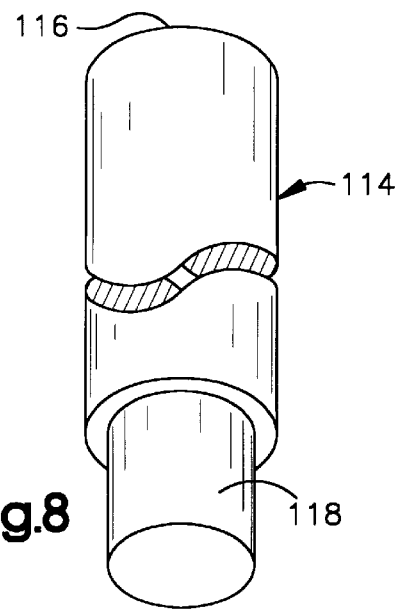
FIG. 8 is an enlarged fragmentary pictorial illustration of a body portion of a column which forms a portion of the main section of the electrical current sensing apparatus of FIG. 5.
Figure 9:
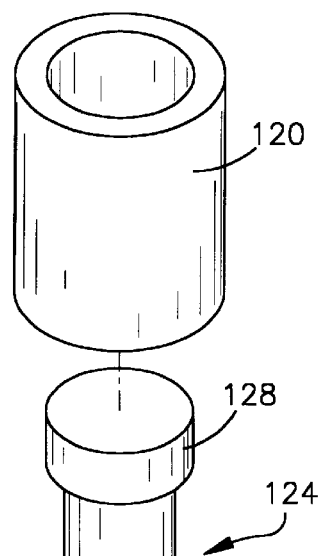
FIG. 9 is an exploded pictorial illustration illustrating a sleeve portion and mounting portion of the column and a base portion which is connected with the column of the main section of the electrical current sensing apparatus of FIG. 5.
Figure 7:
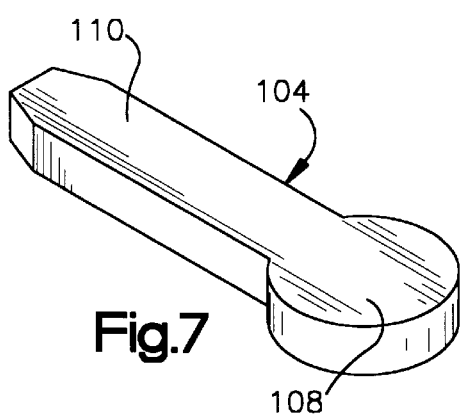
FIG. 7 is an enlarged schematic pictorial illustration of a connector section which forms a portion of a main section of the electrical current sensing apparatus of FIG. 5.

An electrical current is conducted through the conductor 22b in the direction indicated by the arrow 24b in FIG. 5. Electrical current sensing apparatus 40b provides an output over leads 34b which varies as a function of variations in the magnitude of the current conducted through the conductor 22b. The electrical current sensing apparatus 40b includes a magnetic flux concentrator assembly 42b which concentrates a portion of the flux emanating from the conductor 22b and directs the flux to the magnetic flux sensor 20b.

The magnetic flux concentrator assembly 42b includes parallel main sections 50b and 52b. The main sections 50b and 52b are formed of a magnetic material, that is, metal which may contain ferromagnetic elements such as iron, nickel and/or cobalt. The magnetic material of the main sections 50b and 52b is easily demagnetized.

An intermediate section 54b is connected with and is disposed midway between the main sections 50b and 52b. A longitudinal central axis of the intermediate section 54b extends perpendicular to and intersects central axes of the main sections 50b and 52b. The intermediate section 54b is formed of a nonmagnetic material. Although the intermediate section 54b may be formed of many different nonmagnetic materials, in the illustrated embodiment of the invention, the intermediate section 54b is formed of a polymeric material.

A base section 100 extends between the main sections 50b and 52b and is disposed on a side of the conductor 22b opposite from the intermediate section 54b. The base section 100 is formed of a magnetic material which is easily demagnetized. A longitudinal central axis of the base section 100 extends perpendicular to and intersects central axes of the main sections 50b and 52b. Opposite end portions of the base section 100 are connected to the main sections 50b and 52b.

The main section 50b includes a magnetic flux conductive column 70b formed of a magnetic material and a magnetic flux conductive connector section 102 formed of a magnetic material. The connector section 102 is fixedly connected to the column 70b and to the intermediate section 54b. Similarly, the main section 52b includes a magnetic flux conductive column 72b formed of a magnetic material and a magnetic flux conductive connector section 104 formed of a magnetic material. The connector section 104 is fixedly connected to the column 72b and to the intermediate section 54b. The columns 70b and 72b and connector sections 102 and 104 are formed of magnetic material.

In the embodiment of the invention illustrated in FIG. 5, the main sections 50b and 52b are formed by a plurality of magnetic flux conductive members which are fixedly interconnected. Thus, the main section 52b includes the connector section 104 (FIG. 7) formed of a magnetic material. The connector section 104 has a base end portion 108 which is fixedly connected with the column 72b (FIG. 5) by suitable fasteners, welds or a bonding material. An arm 110 (FIG. 7) extends outward from the base end portion 108 into the intermediate section 54b (FIG. 5). The arm 110 is fixedly connected with the intermediate section 54b.

The column 72b of the main section 52b (FIG. 5) includes a cylindrical body 114 (FIG. 8) formed of a magnetic material. The body 114 has a circular upper end surface 116 which is fixedly connected with the base 108 of the connector section 104 in the manner illustrated in FIG. 5. In addition, the body 114 includes a cylindrical end portion 118

(FIG. 8) which is received in a tubular cylindrical metal sleeve 120 (FIG. 9) formed of a magnetic material. The sleeve 120 and end portion 118 of the body 114 (FIG. 8) are fixedly interconnected. In the embodiment of the invention illustrated in FIGS. 5–9, there is an interference fit between the end portion 118 of the body 114 and the inside of the tubular cylindrical sleeve 120. If desired, an appropriate electrically insulating element may be positioned between the members 114 and 120.

A metal mounting pin 124 (FIG. 9) is formed of a magnetic material and fixedly interconnects the sleeve 120 and the base section 100. The mounting pin 124 has a cylindrical shank section 126 and a cylindrical head section 128. The head section 128 is received in the sleeve 120. The shank section 126 is received in an opening 132 (FIG. 9) formed in the base section 100. The base section 100 may be a portion of a support structure for the conductor 22b. Alternatively, the base section 100 may be a member which is separate from the support structure for the conductor 22b.

The column 70b of the main section 50b has the same construction as the column 72b of the main section 52b. Thus, the column 70b includes a body 140 which is fixedly connected with the connector section 102 (FIG. 5). The body 140 extends into a tubular metal sleeve 142. A mounting pin 144 has a cylindrical head section 146 which is received in the cylindrical sleeve 142. In addition, the mounting pin 144 has a cylindrical shank section 148 which extends into an opening (not shown) in the metal base section 100. It should be understood that the columns 70b and 72b both have the same construction and are formed of magnetic materials.

The columns 70b and 72b have parallel central axes. The connector sections 102 and 104 have coincident central axes which extend perpendicular to and intersect the parallel central axes of the columns 70b and 72b. The intermediate section 54b has a central axis which extends parallel to the central axes of the connector sections 102 and 104. The base section 100 has a central axis which extends parallel to the central axis of the intermediate section 54b and to an upper major side surface of the conductor 22b.

In accordance with one of the features of this embodiment of the invention, the mounting pins 124 and 144 extend through openings in the conductor 22 to position the magnetic flux concentrator 42b relative to the conductor 22b. Thus, the shank section 126 (FIG. 9) of the mounting pin 124 (FIG. 5) extends through an opening 152 in the conductor 22b. Similarly, the shank section 148 of the mounting pin 144 extends through an opening 154 in the conductor 22b. The shank sections 126 and 148 of the mounting pins 124 and 144 are gripped by the conductor 22b.

The mounting pins 124 and 144 are fixedly connected to the base section 100. The base section 100 is spaced from the conductor 22b. If desired, a layer of electrically insulating material could be provided between the base section 100 and the conductor 22b.

If the metal base section 100 is formed as a portion of a support structure for the conductor 22b, the mounting pins 124 will cooperate with the base section 100 to position the conductor 22b relative to the base section and other components of the support structure for the conductor 22. If the base section 100 is formed as a member which is separate from the support structure for the conductor 22b, the base section and openings 152 and 154 in the conductor can be located at any desired location along the length of the conductor 22b. If more than one electrical current sensing apparatus 40b is provided along the length of the conductor 22b, one electrical current sensing apparatus 40b could be connected with a base section 100 which forms a part of the support structure for the conductor 22b and another electrical current sensing apparatus 40b could be connected with a base section 100 which is separate from the support structure for the conductor.

The intermediate section 54b (FIG. 6) includes a rectangular recess 60b which extends through the center of the intermediate section 54b. A pair of rectangular recesses 160 and 162 extend axially inward from opposite ends of the intermediate section 54b. The arm 110 on the connector section 104 is received in the rectangular recess 162. Similarly, an arm on the connector section 102 extends into the recess 160.

The recesses 160 and 162 stop short of the recess 160 in which the rectangular magnetic flux sensor 20b is disposed. Thus, a portion of the polymeric material forming the intermediate section 54b is disposed between the recess 160 in which the connector section 102 is received and the recess 60b in which the magnetic flux sensor 20b is received. Similarly, a portion of the polymeric material forming the intermediate section 54b is disposed between the recess 162 in which the arm 110 of the connector section 104 is received and the recess 60b in which the magnetic flux sensor 20b is received.

The intermediate section 54b is connected with the connector sections 102 and 104 by an interference fit between the recesses 160 and 162 and the connector sections. If desired, suitable connectors could also be utilized to interconnect the intermediate section 54b and the connector sections 102 and 104.

The recess 60b in which the magnetic flux-sensor 20b is received has major side surfaces 166 and 168 which extend parallel to each other and perpendicular to coincident longitudinal central axes of the recesses 160 and 162. When the connector sections 102 and 104 are disposed in the recesses 160 and 162, the major side surfaces 166 and 168 of the recess 60b extend perpendicular to the longitudinal central axes of the connector sections 102 and 104. The major side surfaces 166 and 168 of the recess 60b also extend perpendicular to a plane containing the longitudinal central axes of the columns 70b and 72b. The flux sensor 20b is positioned in the recess 60b with the flux sensitive side surfaces 30 and 32 (FIG. 1) of the magnetic flux sensor 20b disposed in flat abutting engagement with the major side surfaces 166 and 168 of the recess 60b.

In accordance with another feature of the present invention, a magnetic flux conductive shunt member 174 is connected with the conductor 22b and base member 100. The shunt member 174 reduces the magnitude of the magnetic flux which is conducted through the main sections 50b and 52b to the intermediate section 54b and the magnetic flux sensor 20b. Thus, a portion of the magnetic flux field emanating from the conductor 22b will extend between the main section 50b and the magnetic material of the shunt member 174. Similarly, another portion of the flux field will extend between the main section 52b and the shunt member 174. This results in a reduction in the total amount of magnetic flux conducted through the flux sensor 20b.

In the illustrated embodiment of the invention, the shunt member 174 has a metal shank portion (not shown) which extends through the conductor 22b and is received in an internally threaded opening in the base 100. A metal head end portion of the shunt member is exposed. The shunt member 174 is disposed midway between the main sections 50b and 52b.

In the embodiment of the invention illustrated in FIG. 5, the main sections 50b and 52b of the magnetic flux concentrator 42b are formed by a plurality of pieces which are fixedly interconnected. By varying the size of the pieces forming the main sections 50b and 52b, the distance between the intermediate section 54b and conductor 22b can be varied. However it is contemplated that the main sections 50b and 52b could each be formed from fewer pieces of material. Thus, the column 70b and connector section 102 could be integrally formed from one piece of material. Similarly, the column 72b and the connector section 104 could be integrally formed from one piece of material. Alternatively, the base section 100, the column 70b, connector section 102, column 72b and connector section 104 could all be integrally formed from one piece of material.

In the embodiment of the invention illustrated in FIG. 5, the columns 70b and 72b extend through openings 152 and 154 formed in the connector 22b. If desired, the columns 70b and 72b could be offset to opposite sides of the connector 22b. Thus, the base section 100 could extend outward of the side of the conductor 22b for a distance sufficient to enable the shank section 126 (FIG. 9) of the mounting pin 124 to extend into the opening 132 in the base section 100 without extending through the conductor 22b. Similarly, the openings at the base section 100 could be such as to enable the mounting pin 144 to engage an opening in the base section adjacent to the longitudinally extending minor side surface of the conductor 22b. If this is done, the base section 100 may be formed as a portion of the support structure for the conductor 22b or may be formed separate from the support structure and connected with the support structure or with the conductor 22b.

Fourth Embodiment of the Electrical Current Sensing Apparatus

In the embodiments of the invention illustrated in FIGS. 1–9, the magnetic flux sensors 20 are spaced from the conductors 22 and the main sections 50 and 52 of the flux concentrators 42 are disposed adjacent to opposite sides of the conductors. In the embodiment of the invention illustrated in FIGS. 10–15, the magnetic flux sensor is disposed adjacent to the conductor and only a portion of the conductor extends between the main sections of the flux concentrator. Since the embodiment of the invention illustrated in FIGS. 10–15 is generally similar to the embodiment of the invention illustrated in FIGS. 1–9, similar numerals will be utilized to designate similar components, the suffix letter "c" being associated with the numerals of FIGS. 10–15 to avoid confusion.

Figure 10:
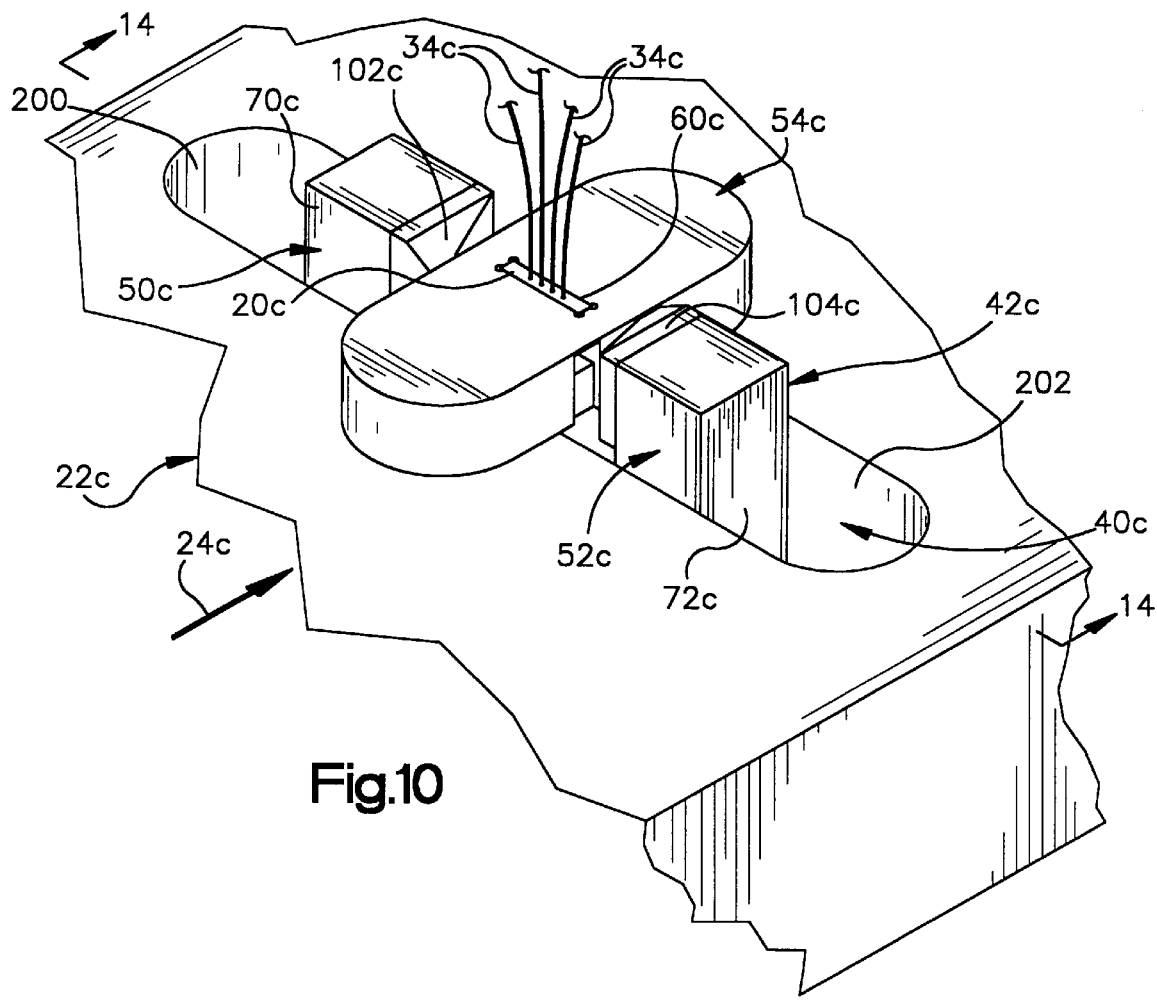
FIG. 10 is a fragmentary schematic illustration depicting a fourth embodiment of the electrical current sensing apparatus in association with a bus bar.
Figure 11:
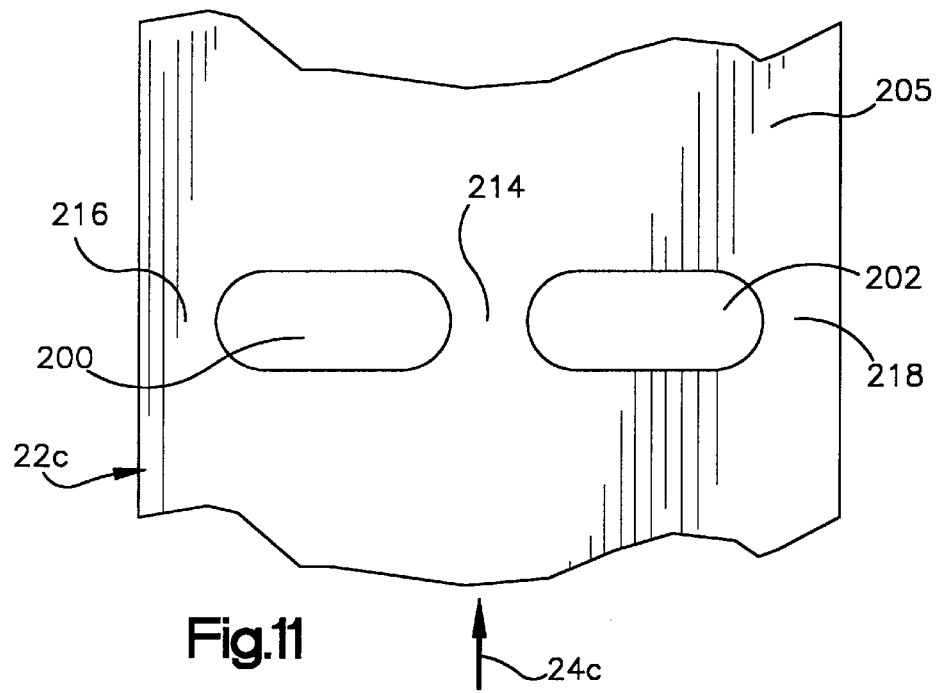
FIG. 11 is a plan view, on a reduced scale, of the bus bar of FIG. 10.

A conductor 22c (FIGS. 10 and 11) conducts electrical current in a direction indicated by an arrow 24c. In this embodiment of the invention, the conductor 22c is a metal bus bar. Variations in the current conducted through the conductor 22c are detected by an electrical current sensing apparatus 40c (FIGS. 10 and 14).

The electrical current sensing apparatus 40c (FIG. 10) includes a magnetic flux sensor 20c which is connected with a suitable control apparatus by leads 34c. Upon a variation in electrical current flowing through the conductor 22c, the magnetic flux sensor 20c provides an output over the leads 34c to initiate a suitable control function. In the illustrated embodiment of the invention, the magnetic flux detector 20c is a Hall effect device.

In addition to the magnetic flux sensor 20c, the electrical current sensing apparatus 40c includes a magnetic flux concentrator assembly 42c. The magnetic flux concentrator assembly 42c includes a pair of spaced apart magnetic flux conductive main sections 50c and 52c (FIGS. 12 and 14). An intermediate section 54c (FIGS. 10 and 13) is fixedly connected with the main sections 50c and 52c (FIG. 10) and is formed of a nonmagnetic material. The flux sensor 20c is disposed in a recess 60c formed in the intermediate section 54c.

The main section 50c (FIGS. 12 and 14) includes a column 70c having a generally rectangular cross sectional configuration and formed of a magnetic material. A connector section 102c (FIG. 12) is formed of a magnetic material and extends from an upper end portion 74c of the column 50c in a direction toward the main section 52c. Similarly, the main section 52c includes a column 72c having a rectangular cross sectional configuration and formed of a magnetic material. A connector section 104c is formed of a magnetic material and extends from an upper end portion 76c of the column 72c toward the main section 50c.

The column 70c, connector section 102c, column 72c and connector section 104c (FIG. 12) are all formed of a magnetic material. A base section 100c (FIGS. 12 and 14) is integrally formed as one piece with the columns 70c and 72c. The base section 100c, columns 70c and 72c and connector sections 102c and 104c are formed of magnetic material and cooperate to at least partially define a rectangular opening 88c. A portion of the conductor 22c is disposed in the opening 88c.

The columns 70c and 72c extend through a pair of spaced apart oval openings 200 and 202 (FIGS. 10 and 11) through the conductor 22c. Although the magnetic flux concentrator assembly 42c has been illustrated in FIG. 10 as being disposed in a pair of openings 200 and 202 formed in the conductor 22c, it is contemplated that the magnetic flux concentrator assembly could be positioned in a different manner relative to the conductor 22c. Thus, the conductor 22c could be a cable having a configuration similar to the configuration of the conductor 22 of FIG. 2 and extend through the opening 88c. Alternatively, the opening 88c could be sufficiently enlarged to enable the entire conductor 22c to extend through the opening.

The base section 100c (FIG. 14) of the flux concentrator assembly 42c abuts a lower side 204 of the conductor 22c. The connector sections 102c and 104c are disposed in engagement with an upper side 205 of the conductor 22c. However, the columns 70c and 72c are spaced from the conductor 22c.

If desired, the connector sections 102c and 104c and the intermediate section 54c could be spaced from the upper side of the conductor 22c in much the same manner as in the embodiment of the invention illustrated in FIG. 5. It is contemplated that a layer of electrically insulating material could be provided between the connector sections 102c and 104c (FIG. 14) and the upper side 205 of the conductor 22c. Similarly, a layer of insulating material could be provided between the base section 100c and the lower side 204 of the conductor 22c.

The connector sections 102c and 104c (FIG. 12) have overlapping arms 206 and 208 which spaced apart from each other. The parallel arms 206 and 208 partially define an opening or slot 210 which extends between the two arms 206 and 208. The magnetic flux sensor 20c (FIG. 10) is disposed in the slot 210 (FIG. 12) between the arms 206 and 208 of the connector sections 102c and 104c. The magnetic flux sensor 20c is oriented with the flux sensitive side surfaces 30 and 32 (FIG. 1) extending parallel to the longitudinal central axes of the arms 206 and 208 on the connector sections 102c and 104c.

In the embodiment of the invention illustrated in FIG. 12, the overlapping connector sections 102c and 104c are formed separately from the metal columns 70c and 72c. The connector sections 102c and 104c are fixedly secured to the columns 70c and 72c by suitable fasteners (not shown). However, the connector sections 102c and 104c could be connected with the columns 70c and 72c by means other than fasteners, such as by welding or bonding. Alternatively, it is contemplated that the connector sections 102c and 104c could be integrally formed as one piece with the columns 70c and 72c.

Figure 15:
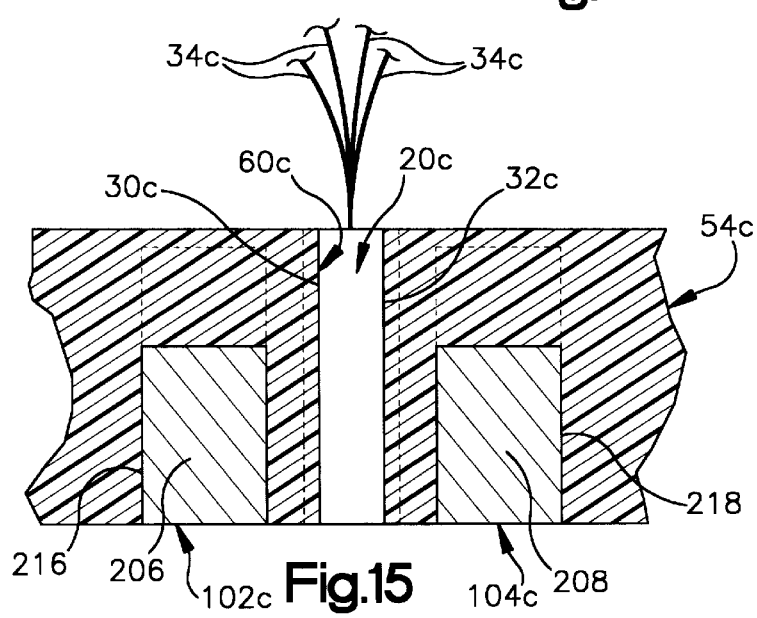
FIG. 15 (on sheet 4 of the drawings) is a fragmentary sectional view, taken generally along the line 13—13 of FIG. 12.

The nonmagnetic intermediate section 54c is provided with a pair of slots 216 and 218 (FIGS. 13 and 15) into which the arms 206 and 208 (FIG. 12) extend in the manner illustrated in FIG. 15. The slots 216 and 218 have parallel longitudinal central axes and extend parallel to major side surfaces of the rectangular recess 60c in which the magnetic flux sensor 20c is disposed. The longitudinal central axes of the slots 216 and 218 (FIG. 13) extend perpendicular to longitudinal central axes of the columns 70c and 72c (FIGS. 10 and 12).

The recess 60c is spaced from the slots 216 and 218 (FIG. 15). The recess 60c positions the rectangular magnetic flux sensor 20c midway between the overlapping arms 206 and 208 on the connector sections 102c and 104c. The nonmagnetic material of the intermediate section 54c extends around the magnetic flux sensor 20c and separates the sensor from the arms 206 and 208.

Flux sensitive side surfaces 30c and 32c on the magnetic flux sensor 20c extend perpendicular to a path of flow of magnetic flux between the two arms 206 and 208 of the connector sections 102c and 104c. Thus, even though the orientation of the magnetic flux sensor 20b has been changed, by 90 degrees from the orientation illustrated in FIGS. 2 and 5, the flux sensitive side surfaces 30c and 32c of the sensor 20c are still perpendicular to the path of flow of magnetic flux.

Only a central portion 214 (FIG. 14) of the conductor 22c extends through the opening 88c formed by the flux concentrator assembly 42c. Side portions 216 and 218 of the conductor 22c are disposed along opposite sides of the flux concentrator assembly 42c. In the illustrated embodiment of the conductor 22c, the openings 200 and 202 divide the conductor 22c into three sections 214, 216 and 218 having the same cross sectional area.

The three sections 214, 216 and 218 have the same cross sectional area as viewed in a plane extending perpendicular to a longitudinal central axis of the conductor 22c, that is, along the line 14—14 of FIG. 10. Therefore, the current 24c is divided into three segments, of approximately equal magnitude, which are conducted between and around the openings 200 and 202. However, it should be understood that the three sections 214, 216 and 218 of the conductor 22c may have different cross sectional areas if desired.

In the embodiments of the invention illustrated in FIGS. 2–9, all of the current in the conductor 22 is conducted through the flux concentrator assembly 42. In the embodiment of the invention illustrated in FIGS. 10–15 only a portion of the current is conducted through the flux concentrator assembly 42c. By varying the relative sizes of the sections 214, 216 and 218 of the conductor 22, the percentage of the total current 24c conducted through the opening 88c in the flux concentrator assembly 42c can be varied.

Conclusion

In view of the foregoing description it is apparent that the present invention provides a new and improved apparatus 40 (FIGS. 2, 4, 5 and 10) for use in sensing electrical current in a conductor 22. The apparatus 40 includes a magnetic flux concentrator assembly 42 which may extend around a portion of a conductor 22. The magnetic flux concentrator assembly 42 may include main sections 50, 52 formed of magnetic material and one or more intermediate sections 54 and/or 56 formed of nonmagnetic material. A magnetic flux sensor 20 is disposed on an intermediate section 54 of the magnetic flux concentrator assembly 42. A plurality of magnetic flux sensors 20 may be utilized if desired.

The main sections 50, 52 of the magnetic flux concentrator 42 may include magnetic flux conductive support columns 70, 72 which are connected with one or more intermediate sections 54 and/or 56. The main sections 50, 52 may also include magnetic flux conductive connector sections 102, 104 which project from the support columns 70, 72. The connector sections 102, 104 may be engaged by an intermediate section formed of nonmagnetic material. The columns 70, 72 may be at least partially disposed in openings 152 and 154 or openings 200 and 202 in the conductor. A magnetic flux conductive base 100 may interconnect the support columns 70, 72.

Having described the invention, the following is claimed:

1. An apparatus for use in sensing electrical current in a conductor, said apparatus comprising a magnetic flux concentrator which extends around a portion of the conductor, said magnetic flux concentrator includes first and second sections formed of a magnetic material and an intermediate section formed of a nonmagnetic material, said first and second sections are disposed adjacent to opposite sides of the conductor, said intermediate section extends between said first and second sections of said magnetic flux concentrator, and a magnetic flux sensor disposed on said intermediate section of said magnetic flux concentrator.

2. An apparatus as set forth in claim 1 wherein said first section of said magnetic flux concentrator includes a first member disposed adjacent to a first side portion of the conductor, said second section of said magnetic flux concentrator includes a second member disposed adjacent to a second side portion of the conductor, said second side portion of the conductor being located opposite to said first side portion of the conductor, said first and second members having axes which extend transverse to a longitudinal central axis of the conductor, said intermediate section being connected with an end portion of said first member and an end portion of said second member, said first and second members and said intermediate section cooperating to at least partially define an opening through which the portion of the conductor extends.

3. An apparatus as set forth in claim 2 wherein said first section of said magnetic flux concentrator includes a third member which is connected to said first member and extends toward said second member, said second section of said magnetic flux concentrator includes a fourth member which is connected to said second member and extends toward said first member, said intermediate section being at least partially disposed between said third and fourth members.

4. An apparatus as set forth in claim 3 wherein said magnetic flux sensor is at least partially disposed in said intermediate section with a magnetic flux sensitive surface of said magnetic flux responsive sensor transverse to central axes of said third and fourth members.

5. An apparatus as set forth in claim 3 wherein said magnetic flux sensor is at least partially disposed in said intermediate section with a magnetic flux sensitive surface parallel to central axes of said third and fourth members.

6. An apparatus as set forth in claim 1 wherein said magnetic flux concentrator includes a second intermediate section formed of a nonmagnetic material and connected with said first and second sections, said second intermediate section being effective to partially define the opening through which the portion of the conductor extends.

7. An apparatus as set forth in claim 6 further including a second magnetic flux sensor mounted on said second intermediate section of said magnetic flux concentrator.

8. An apparatus as set forth in claim 1 wherein said magnetic flux concentrator further includes a base section formed of a magnetic material and connected with said first and second sections, said base section being effective to partially define the opening through which the portion of the conductor extends.

9. An apparatus as set forth in claim 1 wherein said first section of said magnetic flux concentrator is at least partially disposed in a first opening in the conductor and said second section of said magnetic flux concentrator is at least partially disposed in a second opening in the conductor.

10. An apparatus as set forth in claim 1 wherein said first and second sections of said magnetic flux concentrator are spaced from the conductor.

11. An apparatus as set forth in claim 1 wherein said first and second sections of said magnetic flux concentrator are disposed in engagement with the conductor.

12. An apparatus as set forth in claim 1 wherein a magnetic flux sensitive surface of said magnetic flux sensor is at least partially disposed between central axes of said first and second sections of said magnetic flux concentrator, said magnetic flux sensitive surface of said magnetic flux sensor extends transverse to and extends through a plane containing the central axes of said first and second sections of said magnetic flux concentrator.

13. An apparatus as set forth in claim 1 wherein a magnetic flux sensitive surface of said magnetic flux sensor is at least partially disposed between said first and second sections of said magnetic flux concentrator, said magnetic flux sensitive surface of said magnetic flux sensor extends along a plane containing central axes of said first and second sections of said magnetic flux concentrator.

14. An apparatus for use in sensing an electrical current in a conductor, said apparatus comprising a magnetic flux concentrator, said magnetic flux concentrator includes first and second spaced apart magnetic flux conductive sections formed of a magnetic material, a first intermediate section formed of a nonmagnetic material, said first intermediate section having a first end portion connected with a first end portion of said first conductive section and a second end portion connected with a first end portion of said second conductive section, and a second intermediate section formed of a nonmagnetic material, said second intermediate section having a first end portion connected with a second end portion of said first conductive section and a second end portion connected with a second end portion of said second conductive section, and a first magnetic flux sensor disposed on said first intermediate section.

15. An apparatus as set forth in claim 14 further including a second magnetic flux sensor disposed on said second intermediate section.

16. An apparatus as set forth in claim 15 wherein said first magnetic flux sensor has a first magnetic flux sensitive surface and said second magnetic flux sensor has a second magnetic flux sensitive surface which extends generally parallel to said first magnetic flux sensitive surface.

17. An apparatus as set forth in claim 15 wherein said first magnetic flux sensor is disposed midway between said first end portions of said first and second conductive sections and said second magnetic flux sensor is disposed midway between said second end portions of said first and second conductive sections.

18. An apparatus as set forth in claim 15 wherein said first magnetic flux sensor has a first magnetic flux sensitive surface which extends transverse to and through a plane containing central axes of said first and second conductive sections, said second magnetic flux sensor has a second magnetic flux sensitive surface which extends transverse to and through the plane containing central axes of said first and second conductive sections.

19. An apparatus as set forth in claim 14 wherein said first magnetic flux sensor has a magnetic flux sensitive surface which extends transverse to and through a plane containing central axes of said first and second conductive sections.

20. An apparatus as set forth in claim 14 wherein said first and second conductive sections and said first and second intermediate sections cooperate to at least partially define an opening through which a portion of the conductor extends.

21. An apparatus for use in sensing an electrical current in a conductor, said apparatus comprising a magnetic flux concentrator, said magnetic flux concentrator includes first and second spaced apart magnetic flux conductive sections formed of a magnetic material, an intermediate section formed of a nonmagnetic material, said intermediate section having a first portion connected with a first end portion of said first conductive section and a second portion connected with a first end portion of said second conductive section, and a third magnetic flux conductive section formed of a magnetic material, said third conductive section having a first end portion connected with a second end portion of said first conductive section and a second end portion connected with a second end portion of said second conductive section, and a magnetic flux sensor disposed on said intermediate section.

22. An apparatus as set forth in claim 21 wherein said magnetic flux concentrator includes a fourth magnetic flux conductive section, said fourth conductive section having a first end portion connected with said first end portion of said first conductive section and a second end portion connected with said intermediate section, and a fifth magnetic flux conductive section, said fifth conductive section having a first end portion connected with said first end portion of said second conductive section and a second end portion connected with said intermediate section.

23. An apparatus as set forth in claim 22 wherein said magnetic flux sensor is disposed between said second end portion of said fourth conductive section and said second end portion of said fifth conductive section.

24. An apparatus as set forth in claim 23 wherein said magnetic flux sensor has a magnetic flux sensitive surface which extends transverse to a plane containing central axes of said first and second conductive sections.

25. An apparatus as set forth in claim 23 wherein said magnetic flux sensor has a magnetic flux sensitive surface which extends parallel to a plane containing central axes of said first and second conductive sections.

26. An apparatus as set forth in claim 22 wherein said intermediate section includes first surface means for defining a first recess in which said second end portion of said fourth conductive section is at least partially disposed and second surface means for defining a second recess in which said second end portion of said fifth conductive section is at least partially disposed, said magnetic flux sensor being at least partially disposed between said first and second recesses in said intermediate section.

27. An apparatus as set forth in claim 21 further including a member formed of a magnetic flux conductive material and disposed midway between and connected with said first and second conductive sections of said magnetic flux concentrator to enable magnetic flux to be conducted between said first and second conductive sections of said magnetic flux concentrator and said member formed of a magnetic flux conductive material.

28. An apparatus for use in sensing an electrical current in a conductor, said apparatus comprising a magnetic flux concentrator, said magnetic flux concentrator includes first and second spaced apart magnetic flux conductive sections formed of a magnetic material, said first conductive section having a first portion disposed in engagement with the conductor at a first location on the conductor and an end portion spaced from the conductor, said second conductive section having a first portion disposed in engagement with the conductor at a second location on the conductor and an end portion spaced from the conductor, and an intermediate section formed of a nonmagnetic material, said intermediate section having a first portion connected with said end portion of said first conductive section and a second portion connected with said end portion of said second conductive section, and a magnetic flux sensor disposed on said intermediate section of said magnetic flux concentrator at a location between said first and second conductive sections.

29. An apparatus as set forth in claim 28 wherein said magnetic flux sensor has a magnetic flux sensitive surface which extends transverse to a plane containing central axes of said first and second conductive sections.

30. An apparatus as set forth in claim 28 wherein said flux concentrator further includes a second intermediate section formed of a magnetic flux conductive material and connected with said first and second conductive sections at a location spaced from said intermediate section formed of a nonmagnetic material.

31. An apparatus as set forth in claim 28 wherein said first portion of said first conductive section is an end portion of said first conductive section and said first portion of said second conductive section is an end portion of said second conductive section.

32. An apparatus for use in sensing an electrical current in a conductor, said apparatus comprising a magnetic flux concentrator, said magnetic flux concentrator includes first and second spaced apart magnetic flux conductive sections formed of magnetic material, a portion of the conductor being disposed between said first and second conductive sections, a third magnetic flux conductive section formed of a magnetic material and extending from said first conductive section in a direction toward said second conductive section, a fourth magnetic flux conductive section formed of a magnetic material and extending from said second conductive section in a direction toward said first conductive section, said third and fourth conductive sections having end portions which are spaced apart, and an intermediate section formed of a nonmagnetic material and connected with said end portions of said third and fourth conductive sections, and a magnetic flux sensor disposed on said intermediate section of said magnetic flux concentrator, said magnetic flux sensor having a magnetic flux sensitive surface which is at least partially disposed between said end portions of said third and fourth conductive sections.

33. An apparatus as set forth in claim 32 wherein said third and fourth conductive sections have central axes which extend through said magnetic flux sensitive surface of said magnetic flux sensor.

34. An apparatus as set forth in claim 32 wherein said third and fourth conductive sections have central axes which extend along said magnetic flux sensitive surface of said magnetic flux sensor.

35. An apparatus as set forth in claim 32 wherein said third and fourth conductive sections have a combined length which is less than a distance between said first and second conductive sections, said magnetic flux sensor being disposed between end surfaces on said third and fourth conductive sections.

36. An apparatus as set forth in claim 32 wherein said third and fourth conductive sections have a combined length which is greater than a distance between said first and second conductive sections, said end portions of said third and fourth conductive sections being disposed in an overlapping relationship, said magnetic flux sensor being at least partially disposed between said overlapping end portions of said third and fourth conductive sections.

37. An apparatus as set forth in claim 32 wherein said first conductive section has a portion disposed in engagement with the conductor at a first location and said second conductive section has a portion disposed in engagement with the conductor at a second location which is spaced from the first location.

38. An apparatus as set forth in claim 32 further including a member formed of a magnetic material and disposed between and connected with said first and second conductive sections to enable magnetic flux to be conducted between said first and second conductive sections of said magnetic flux concentrator and said member formed of a magnetic material.

39. An apparatus as set forth in claim 32 wherein said magnetic flux concentrator further includes a fifth conductive section which extends between said first and second conductive sections and is connected with said first and second conductive sections at a location spaced from said intermediate section.

40. An apparatus comprising a conductor having first and second openings formed therein, a magnetic flux concentrator, said magnetic flux concentrator having a first portion at least partially disposed in the first opening in said conductor and a second portion at least partially disposed in the second opening in said conductor, and a magnetic flux sensor disposed on said magnetic flux concentrator.

41. An apparatus as set forth in claim 40 wherein said first portion of said magnetic flux concentrator includes a first section formed of a magnetic material, said second portion of said magnetic flux concentrator includes a second section formed of a magnetic material, said magnetic flux concentrator further includes an intermediate section formed of a nonmagnetic material and connected with said first and second sections, said magnetic flux sensor being disposed on said intermediate section of said magnetic flux concentrator.

42. An apparatus as set forth in claim 41 wherein a portion of said conductor is disposed between said first and second sections of said magnetic flux concentrator.

43. An apparatus as set forth in claim 41 wherein said first section of said magnetic flux concentrator is gripped by a first portion of said conductor and said second section of said magnetic flux concentrator is gripped by a second portion of said conductor.

44. An apparatus as set forth in claim 41 wherein said first and second sections of said magnetic flux concentrator are disposed in engagement with said conductor, said intermediate section of said magnetic flux concentrator is spaced apart from said conductor.

45. An apparatus as set forth in claim 41 wherein said magnetic flux concentrator includes a second intermediate section connected with said first and second sections.

46. An apparatus as set forth in claim 40 wherein said magnetic flux concentrator includes a section formed of a magnetic material and connected with said first and second sections.

47. An apparatus as set forth in claim 40 wherein said magnetic flux sensor includes a magnetic flux sensitive surface which extends along a longitudinal central axis of said conductor.

48. An apparatus as set forth in claim 40 wherein said magnetic flux sensor includes a magnetic flux sensitive surface which extends transverse to a longitudinal central axis of said conductor.

49. An apparatus for use in sensing electrical current in a conductor, said apparatus comprising a first main section which is formed of magnetic material and extends in a first direction from the conductor, said first direction being transverse to a longitudinal central axis of the conductor, said first main section having a mounting portion which is connected to the conductor and an end portion which is offset from the conductor in the first direction, a second main section which is formed of magnetic material and extends in the first direction from the conductor, said second main section having a mounting portion which is connected to the conductor and an end portion which is offset from the conductor in the first direction, an intermediate section which is formed of a nonmagnetic material and is connected with said end portion of said first main section and with said end portion of said second main section, and a magnetic flux sensor disposed on said intermediate section at a location at least partially disposed between and spaced apart from said end portions of said first and second main sections.

50. An apparatus as set forth in claim 49 wherein said magnetic flux sensor is spaced in the first direction from the conductor.

51. An apparatus as set forth in claim 49 wherein said first and second main sections have generally cylindrical configurations and parallel central axes disposed in a plane which intersects the longitudinal central axis of the conductor.

52. An apparatus as set forth in claim 49 wherein said intermediate section is spaced apart from said conductor.

53. An apparatus as set forth in claim 49 wherein said first and second main sections have portions which extend in a second direction from the conductor, said second direction being opposite from said first direction, and base section formed of magnetic material, said base section being connected to said portions of said first and second main sections which extend in the second direction from the conductor.

54. An apparatus as set forth in claim 49 wherein said magnetic flux sensor has a magnetic flux sensitive surface which extends through a plane containing central axes of said first and second main sections.

55. An apparatus as set forth in claim 49 wherein said magnetic flux sensor has a magnetic flux sensitive surface which extends generally parallel to a plane containing central axes of said first and second main sections.

56. An apparatus for use in sensing electrical current in a conductor, said apparatus comprising a first member which is formed of magnetic material an has a straight longitudinal central axis, a second member which is formed of magnetic material and has a straight longitudinal central axis which extends generally parallel to the longitudinal central axis of said first member, an intermediate section which is formed of a nonmagnetic material and extends between a first end portion of said first member and a first end portion of said second member, said first and second members and said intermediate section cooperating to at least partially define a space through which a portion of said conductor extends, said central axes of said first and second members being disposed in a plane which intersects a central axis of said conductor, and a magnetic flux sensor mounted on said intermediate section at a location which is spaced apart from said first and second members and is a least partially disposed between said first end portion of said first member and said first end portion of said second member.

57. An apparatus as set forth in claim 56 wherein said magnetic flux sensor has a magnetic flux sensitive surface which extends through the plane in which the central axes of said first and second members are disposed.

58. An apparatus as set forth in claim 56 further including a second intermediate section which is formed of a nonmagnetic material and extends between a second end portion of said first member and a second end portion of said second member, said second intermediate section being effective to further define the space through which a portion of said conductor extends.

59. An apparatus as set forth in claim 58 further including a second magnetic flux sensor mounted on said second intermediate section at a location which is spaced apart from said first and second members and is at least partially disposed between said second end portion of said first member and said second end portion of said second member.

60. An apparatus for use in sensing electrical current in a conductor having first and second spaced apart openings, said apparatus comprising a first section which extends into the first opening in the conductor and is formed of a magnetic material, a second section which extends into the second opening in the conductor and is formed of a magnetic material, and an intermediate section which is formed of a nonmagnetic material and is connected with said first and second sections, said intermediate section being at least partially disposed between said first and second sections, and a magnetic flux sensor disposed on said intermediate section at a location at least partially disposed between said first and second sections.

61. An apparatus as set forth in claim 60 further including a third section formed of a magnetic material and extending from said first section toward said second section, and a fourth section formed of a magnetic material and extending from said second section toward said first section, said magnetic flux sensor being at least partially disposed between said third and fourth sections.

62. An apparatus as set forth in claim 61 wherein said magnetic flux sensor includes a flux sensitive surface which extends generally parallel to a longitudinal axis of the conductor.

63. An apparatus as set forth in claim 61 wherein said magnetic flux sensor includes a flux sensitive surface which extends transversely to a longitudinal central axis of the conductor.

64. An apparatus comprising a conductor having flat upper and lower side surfaces, said conductor having a first surface which at least partially defines a first opening which extends between said upper and lower side surfaces of said conductor, said conductor having a second surface which at least partially defines a second opening which extends between said upper and lower side surfaces, a first cylindrical main section which is formed of magnetic material and extends into said first opening in said conductor, a second cylindrical main section which is formed of magnetic material and extends into said second opening in said conductor, an intermediate section which is connected with an end portion of said first main section and an end portion of said second main section, said intermediate section being formed of a nonmagnetic material, said intermediate section defining a recess disposed midway between said end portion of said first main section and said end portion of said second main section, and a magnetic flux sensor disposed in said recess in said intermediate section in a spaced apart relationship with said end portions of said first and second main sections, said magnetic flux sensor having a flux sensitive surface which extends through a plane containing central axes of said first and second main sections, said magnetic flux sensor having an output which varies as a function of variations in electrical current conducted through said conductor.

* * * * *